US010084000B2

United States Patent
Tian (10) Patent No.: US 10,084,000 B2
(45) Date of Patent: Sep. 25, 2018

(54) ARRAY SUBSTRATE, MANUFACTURING METHOD THEREFOR, DISPLAY PANEL, AND DISPLAY APPARATUS

(71) Applicant: BOE Technology Group Co., Ltd., Beijing (CN)

(72) Inventor: Xueyan Tian, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/537,748

(22) PCT Filed: Sep. 2, 2016

(86) PCT No.: PCT/CN2016/097961
§ 371 (c)(1),
(2) Date: Jun. 19, 2017

(87) PCT Pub. No.: WO2017/067336
PCT Pub. Date: Apr. 27, 2017

(65) Prior Publication Data
US 2018/0040648 A1    Feb. 8, 2018

(30) Foreign Application Priority Data

Oct. 23, 2015 (CN) .......................... 2015 1 0697688

(51) Int. Cl.
*H01L 29/04*    (2006.01)
*H01L 27/12*    (2006.01)
(Continued)

(52) U.S. Cl.
CPC .... *H01L 27/1296* (2013.01); *H01L 21/02532* (2013.01); *H01L 21/02592* (2013.01);
(Continued)

(58) Field of Classification Search
CPC ............. H01L 27/1296; H01L 27/1229; H01L 27/1233; H01L 27/1285; H01L 27/1288; H01L 27/3262
See application file for complete search history.

(56) References Cited

U.S. PATENT DOCUMENTS

| | | | | |
|---|---|---|---|---|
| 5,612,235 A | * | 3/1997 | Wu ..................... | H01L 27/1214 257/E21.414 |
| 2002/0070406 A1 | * | 6/2002 | Yamazaki ............. | H01L 27/105 257/314 |

(Continued)

FOREIGN PATENT DOCUMENTS

| | | |
|---|---|---|
| CN | 1536620 A | 10/2004 |
| CN | 1681361 A | 10/2005 |

(Continued)

OTHER PUBLICATIONS

Dec. 14, 2016—(WO) International Search Report and Written Opinion Appn PCT/CN2016/097961 with English Tran.

(Continued)

*Primary Examiner* — Yosef Gebreyesus
(74) *Attorney, Agent, or Firm* — Banner & Witcoff, Ltd.

(57) ABSTRACT

An array substrate and manufacturing method thereof, a display panel and a display device are provided. The array substrate includes a display area and a peripheral circuit area. The method includes forming an amorphous silicon thin film on the base substrate, forming a first amorphous silicon layer in the display area and a second amorphous silicon layer in the peripheral circuit area by a patterning process, so that a thickness of the first amorphous silicon layer is less than a thickness of the second amorphous silicon layer; and processing the first amorphous silicon layer and the second amorphous silicon layer simultaneously by an excimer laser annealing to form a first poly-silicon layer in the display area and a second poly-silicon layer in the (Continued)

peripheral circuit area, a grain size of the first poly-silicon layer being less than a grain size of the second poly-silicon layer.

10 Claims, 5 Drawing Sheets

(51) Int. Cl.
- *H01L 21/02* (2006.01)
- *H01L 29/786* (2006.01)
- *G02F 1/1345* (2006.01)
- *H01L 27/32* (2006.01)
- *G02F 1/1368* (2006.01)

(52) U.S. Cl.
CPC .... *H01L 21/02686* (2013.01); *H01L 27/1229* (2013.01); *H01L 27/1233* (2013.01); *H01L 27/1285* (2013.01); *H01L 27/1288* (2013.01); *H01L 29/78675* (2013.01); *G02F 1/1368* (2013.01); *G02F 1/13454* (2013.01); *G02F 2202/104* (2013.01); *H01L 27/3262* (2013.01)

(56) References Cited

U.S. PATENT DOCUMENTS

| | | | |
|---|---|---|---|
| 2004/0188683 A1 | 9/2004 | Hotta | |
| 2005/0225253 A1* | 10/2005 | Yamada | H01L 27/1214 315/169.3 |
| 2006/0172091 A1* | 8/2006 | Tung | G02F 1/133711 428/1.32 |
| 2007/0176180 A1 | 8/2007 | Hsu et al. | |
| 2007/0284584 A1 | 12/2007 | Chan et al. | |
| 2008/0079010 A1* | 4/2008 | Kim | H01L 27/1251 257/88 |
| 2008/0157099 A1* | 7/2008 | Yang | G09G 3/3233 257/83 |
| 2012/0086013 A1 | 4/2012 | Lee et al. | |
| 2014/0065804 A1 | 3/2014 | Tian et al. | |
| 2014/0141579 A1 | 5/2014 | Tian et al. | |
| 2017/0098667 A1 | 4/2017 | Zhang | |

FOREIGN PATENT DOCUMENTS

| | | |
|---|---|---|
| CN | 101075635 A | 11/2007 |
| CN | 101170076 A | 4/2008 |
| CN | 101593730 | 12/2009 |
| CN | 101656232 A | 2/2010 |
| CN | 102148259 A | 8/2011 |
| CN | 102709160 A | 10/2012 |
| CN | 102945789 A | 2/2013 |
| CN | 103487999 A | 1/2014 |
| CN | 104064451 A | 9/2014 |
| CN | 104701265 A | 6/2015 |
| CN | 105206569 A | 12/2015 |
| TW | 200602776 A | 1/2006 |

OTHER PUBLICATIONS

Sep. 5, 2017—(CN) First Office Action Appn 201510697688.8 with English Tran.

May 4 2018—(CN) Second Office Action Appn 201510697688.8 with English Tran.

* cited by examiner

Fig. 1 forming an amorphous silicon thin film on the base substrate, forming a first amorphous silicon layer in the display area and a second amorphous silicon layer in the peripheral circuit area by a patterning process, so that a thickness of the first amorphous silicon layer is less than a thickness of the second amorphous silicon layer processing the first amorphous silicon layer and the second amorphous silicon layer simultaneously by an excimer laser annealing to form a first poly-silicon layer located in the display area and a second poly-silicon layer located in the peripheral circuit area, a grain size of the first poly-silicon layer being less than a grain size of the second poly-silicon layer

ARRAY SUBSTRATE, MANUFACTURING METHOD THEREFOR, DISPLAY PANEL, AND DISPLAY APPARATUS

The application is a U.S. National Phase Entry of International Application No. PCT/CN2016/097961 filed on Sep. 2, 2016, designating the United States of America and claiming priority to Chinese Patent Application No. 201510697688.8, filed on Oct. 23, 2015. The present application claims priority to and the benefit of the above-identified applications and the above-identified applications are incorporated by reference herein in their entirety.

TECHNICAL FIELD

Embodiments of the present disclosure relate to an array substrate and manufacturing method thereof, a display panel and a display device.

BACKGROUND

Active matrix organic light emitting diode (AMOLED) has become the best choice for future display technology due to the advantages such as high quality, short response time, low power consumption, wide viewing angle and ultra light, ultra thin, or the like.

At present, in a backplane technology of the AMOLED, methods such as excimer laser annealing (ELA), solid phase crystallization (SPC), metal induced crystallization (MIC) and the like have been adopted to manufacture a poly-silicon layer of a thin film transistor. The ELA technology, which is adopted to obtain the poly-silicon layer of the thin film transistor in the backplane, is the only one method to achieve mass production.

However, in the AMOLED display device manufactured by the conventional methods, a low temperature poly-silicon thin film transistor in a peripheral circuit area needs to have high electron mobility, and a low temperature poly-silicon thin film transistor in a display area needs to have low leakage current. But at present, in the low temperature poly-silicon thin film transistor, a grain size of the poly-silicon layer in the display area and a grain size of the poly-silicon layer in the peripheral circuit area are the same, so the low temperature poly-silicon thin film transistor cannot satisfy requirements in the display area and in the peripheral circuit area at the same time.

To sum up, the poly-silicon layer manufactured by the conventional methods can not satisfy the requirements of the low temperature poly-silicon thin film transistor in the display area and in the peripheral circuit area at the same time.

SUMMARY

At least one embodiment of the present disclosure provides a method for manufacturing an array substrate, comprising manufacturing a poly-silicon layer, and the method comprises: forming an amorphous silicon thin film on a base substrate, forming a first amorphous silicon layer in a display area and a second amorphous silicon layer in a peripheral circuit area by a patterning process, so that a thickness of the first amorphous silicon layer is less than a thickness of the second amorphous silicon layer; processing the first amorphous silicon layer and the second amorphous silicon layer simultaneously by an excimer laser annealing to form a first poly-silicon layer located in the display area and a second poly-silicon layer located in the peripheral circuit area, a grain size of the first poly-silicon layer being less than a grain size of the second poly-silicon layer.

In the manufacturing method of the array substrate according to the present disclosure, since a thickness of the amorphous silicon layer in the display area is less than a thickness of the amorphous silicon layer in the peripheral circuit area, and then when the poly-silicon layer is formed by the following excimer laser annealing, the grain size of the second poly-silicon layer formed in the peripheral circuit area is larger than the grain size of the first poly-silicon layer formed in the display area, therefore after adopting the first poly-silicon layer formed in the display area and the second poly-silicon layer formed in the peripheral circuit area to form thin film transistors respectively, the thin film transistor in the peripheral circuit area can satisfy the requirement of high electron mobility; and the thin film transistor in the display area can satisfy the requirement of low leakage current.

In an embodiment of the present disclosure, forming the first amorphous silicon layer in the display area and the second amorphous silicon layer in the peripheral circuit area by the patterning process comprises: coating photoresist on the amorphous silicon thin film, forming a photoresist completely reserving area, a photoresist partially reserving area and a photoresist completely removing area by exposing and developing the photoresist with a half-tone or gray-tone mask; the photoresist completely reserving area corresponding to an area for forming the amorphous silicon layer in the peripheral circuit area, the photoresist partially reserving area corresponding to an area for forming the amorphous silicon layer in the display area, and the photoresist completely removing area corresponding to other areas in the display area and the peripheral circuit area; removing the amorphous silicon thin film in the photoresist completely removing area by a first etching; removing the photoresist of the photoresist partially reserving area, removing a part of the whole thickness of the amorphous silicon thin film in the photoresist partially reserving area by a second etching to form the first amorphous silicon layer; and removing the photoresist in the photoresist completely reserving area to form the second amorphous silicon layer.

In an embodiment of the present disclosure, the thickness of the first amorphous silicon layer is 40 nm to 50 nm; and the thickness of the second amorphous silicon layer is 60 nm to 80 nm.

In an embodiment of the present disclosure, before processing the first amorphous silicon layer and the second amorphous silicon layer by the excimer laser annealing, the method further comprises: heating the first amorphous silicon layer and the second amorphous silicon layer for 0.5 to 3 hours at a temperature of 400° C. to 450° C.

In an embodiment of the present disclosure, during the excimer laser annealing, a xenon chloride laser or a krypton fluoride laser or an argon fluoride laser is adopted.

In an embodiment of the present disclosure, during the excimer laser annealing, the laser has a pulse frequency of 450 Hz to 550 Hz, an overlap rate of 92% to 98%, a scanning speed of 4 mm/s to 16 mm/s, and an energy density of 300 mJ/cm$^2$ to 500 mJ/cm$^2$.

At least one embodiment of the present disclosure further provides an array substrate, and the array substrate is formed by the above mentioned method.

In an embodiment of the present disclosure, a thickness of the first poly-silicon layer of the thin film transistor in the display area is 40 nm to 50 nm; and a thickness of the second poly-silicon layer of the thin film transistor in the peripheral circuit area is 60 nm to 80 nm.

At least one embodiment of the present disclosure further provides a display panel, and the display panel comprises the above mentioned array substrate.

At least one embodiment of the present disclosure further provides a display device, and the display device comprises the above mentioned display panel.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Figure 1:
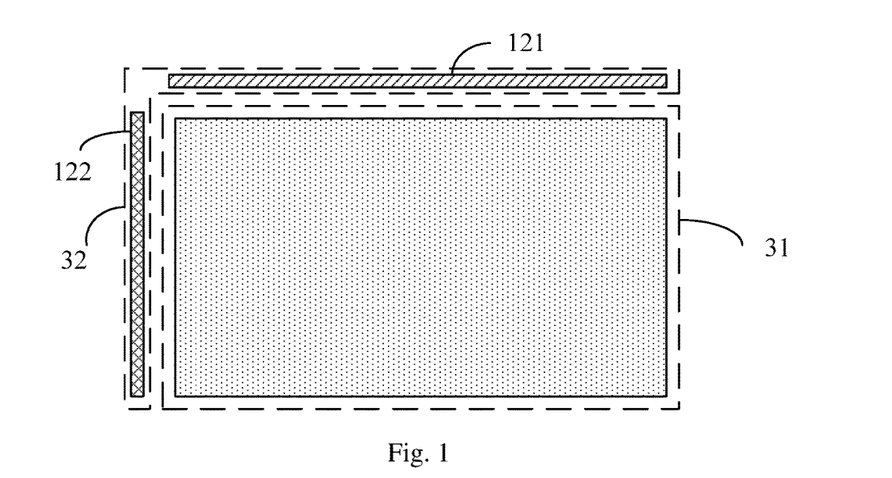
FIG. 1 is a structure schematic view of an array substrate according to an embodiment of the present disclosure.

At least one embodiment of the present disclosure provides a method for manufacturing an array substrate, as illustrated in FIG. 1, the array substrate comprises a display area 31 and a peripheral circuit area 32, a thin film transistor (not illustrated in the Figure) for driving a pixel electrode (not illustrated in the Figure) is formed in the display area 31, an active driving circuit region 121, a gate electrode (not illustrated in the Figure) and the other driving circuit region 122 are formed in the peripheral circuit area 32.

Figure 2:
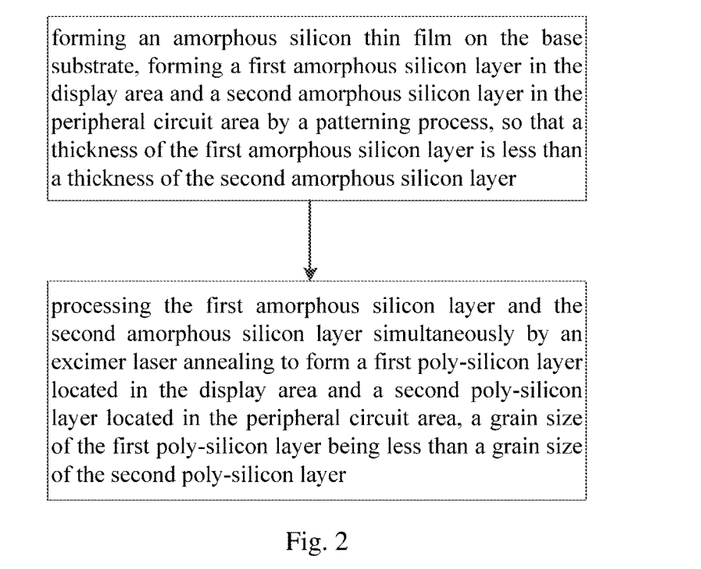
FIG. 2 is a flow chart for illustrating a method for manufacturing a poly-silicon layer in the array substrate according to an embodiment of the present disclosure.

As illustrated in FIG. 2, the method comprises manufacturing a poly-silicon layer on a base substrate, which comprises forming an amorphous silicon thin film on the base substrate, forming a first amorphous silicon layer in a display area and a second amorphous silicon layer in a peripheral circuit area by a patterning process, so that a thickness of the first amorphous silicon layer is less than a thickness of the second amorphous silicon layer; processing the first amorphous silicon layer and the second amorphous silicon layer simultaneously by an excimer laser annealing to form a first poly-silicon layer located in the display area and a second poly-silicon layer located in the peripheral circuit area, a grain size of the first poly-silicon layer being less than a grain size of the second poly-silicon layer.

Hereinafter a method for manufacturing a poly-silicon layer of a thin film transistor according to an embodiment of the present disclosure will be described in detail. In the embodiment, the base substrate is of a glass substrate, which is taken as an example.

Figure 3:
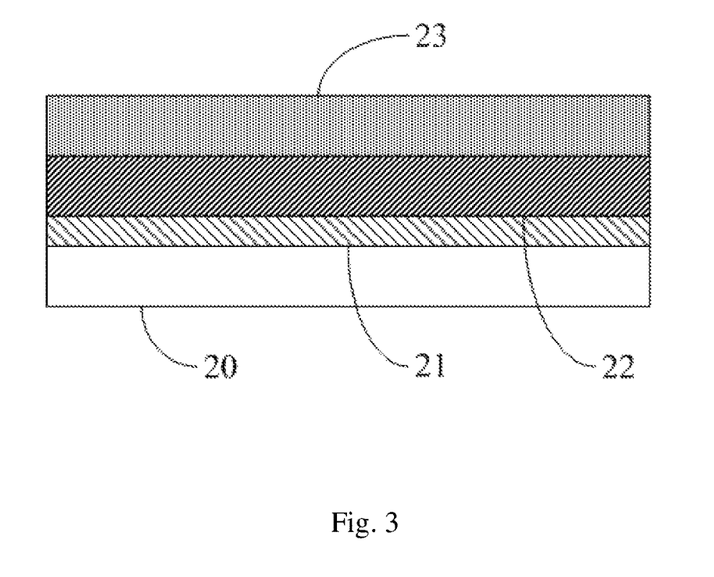
FIG. 3 is a structure schematic view of a cross-section of the array substrate after forming a poly-silicon thin film in the manufacturing method of the array substrate according to an embodiment of the present disclosure.

Firstly, the base substrate 20 is pre-cleaned. Then a buffer layer is formed on the base substrate 20. In the embodiment, the formed buffer layer has a two-layer structure. For instance, firstly a SiN layer 21 of 50 nm to 150 nm is deposited by plasma enhanced chemical vapor deposition (PECVD), and then a $SiO_2$ layer 22 of 100 nm to 350 nm is deposited, the SiN layer 21 and the $SiO_2$ layer 22 are used as the buffer layer of the present embodiment. It is to be noted that in the embodiment of the present disclosure the buffer layer can have a single structure or can be not formed. Then an amorphous silicon thin film 23 is deposited on the base substrate having the buffer layer. The formed structure is illustrated in FIG. 3.

After that, a first amorphous silicon layer is formed in the display area 31 and a second amorphous silicon layer is formed in the peripheral circuit area 32 by a patterning process, so that a thickness of the first amorphous silicon layer is less than a thickness of the second amorphous silicon layer. In the embodiment, for instance, the thickness of the first amorphous silicon layer in the display area is 40 nm to 50 nm; and the thickness of the second amorphous silicon layer in the peripheral circuit area is 60 nm to 80 nm.

Figure 4:
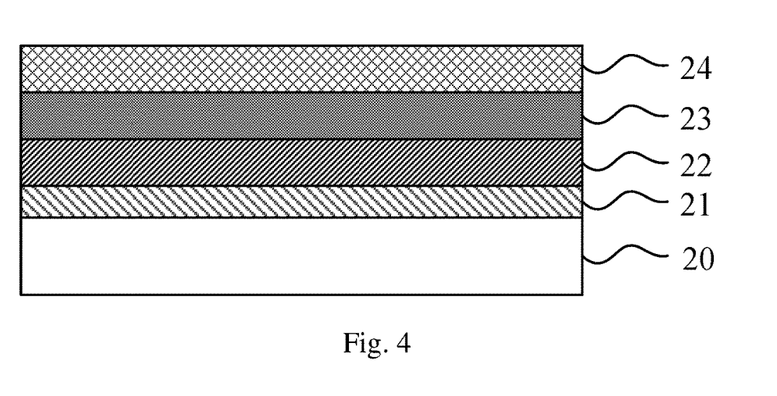
FIG. 4 is a structure schematic view of a cross-section of the array substrate after forming photoresist in the manufacturing method of the array substrate according to an embodiment of the present disclosure.
Figure 5:
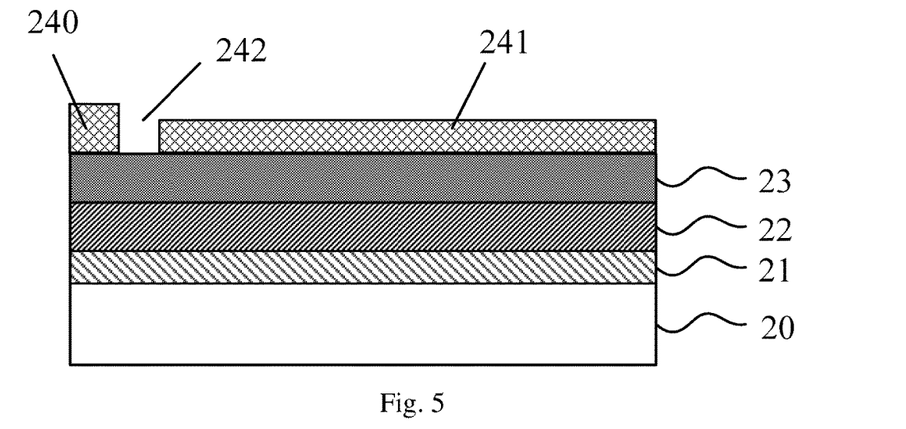
FIG. 5 is a structure schematic view of a cross-section of the array substrate formed after exposing and developing the photoresist in the manufacturing method of the array substrate according to an embodiment of the present disclosure.

The patterning process in the present disclosure comprises a part or all of the processes such as photoresist coating, exposure, development, etching and photoresist removing. For instance, as illustrated in FIG. 4, photoresist 24 is coated on the deposited amorphous silicon thin film 23, a photoresist completely reserving area 240, a photoresist partially reserving area 241 and a photoresist completely removing area 242 are formed by exposing and developing the photoresist with a half-tone or gray-tone mask; the photoresist completely reserving area 240 corresponds to an area, where the amorphous silicon layer is to be formed, in the peripheral circuit area 32, the photoresist partially reserving area 241 corresponds to an area, where the amorphous silicon layer is to be formed, in the display area 31 and the photoresist completely removing area 242 corresponds to other areas in the display area 31 and the peripheral circuit area 32, a cross-section view of the formed structure is illustrated in FIG. 5.

Figure 6:
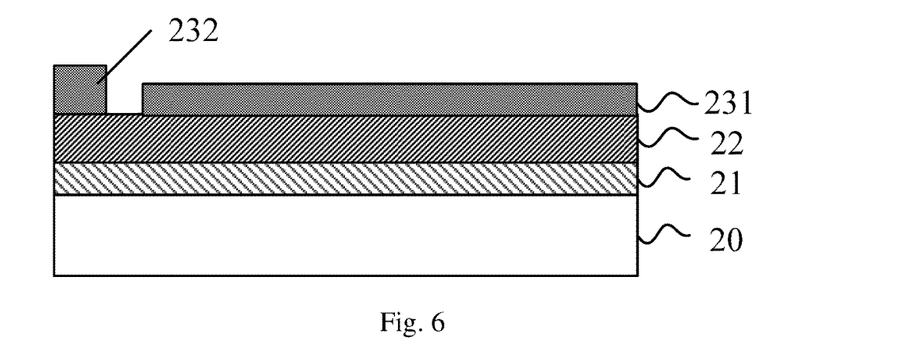
FIG. 6 is a structure schematic view of a cross-section of the array substrate formed after forming the first amorphous silicon layer and the second amorphous silicon layer in the manufacturing method of the array substrate according to an embodiment of the present disclosure.

After that, the amorphous silicon thin film located in an area, which is not covered by the photoresist, of the photoresist completely removing area 242 is removed by a first dry etching; then the photoresist of the photoresist partially reserving area is removed by an ashing process, so as to expose the amorphous silicon thin film in the display area 31, a part of the whole thickness, such as 20 nm to 30 nm, of the amorphous silicon thin film in the display area is removed by a second dry etching to form the first amorphous silicon layer 231, a thickness of which is about 40 nm to 50 nm, in the display area 31; finally, the remaining photoresist is removed to form the second amorphous silicon layer 232 of 60 nm to 80 nm in the peripheral circuit area 32. The formed structure is illustrated in FIG. 6. It is to be noted that the skilled in the field can select the thicknesses of the first amorphous silicon layer 231 and the second amorphous silicon layer 232 according to design requirements, as long as the thickness of the first amorphous silicon layer 231 is less than the thickness of the second amorphous silicon layer 232.

Figure 7:
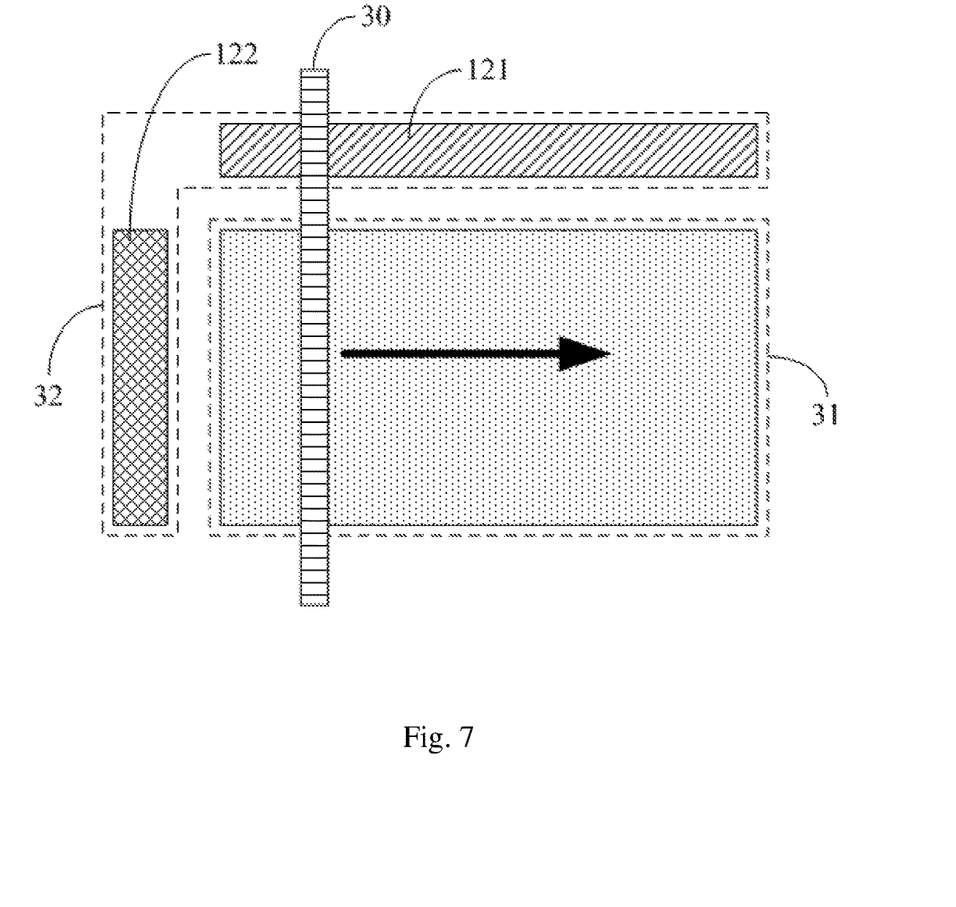
FIG. 7 is a plan structure schematic view of forming the poly-silicon layer by adopting the excimer laser annealing according to an embodiment of the present disclosure.

Then, as illustrated in FIG. 7, the first amorphous silicon layer 231 of the display area 31 and the second amorphous silicon layer 232 of the peripheral circuit area 32 are subjected to the excimer laser annealing process simultaneously, so that the amorphous silicon layer 231 of the display area 31 and the amorphous silicon layer 232 of the peripheral circuit area 32 respectively form a first poly-silicon layer and a second poly-silicon layer.

The peripheral circuit area 32 comprises the active driving circuit region 121, the gate electrode (not illustrated in the Figure) and the other driving circuit region 122, a thickness of the first poly-silicon layer of the thin film transistor located in the display area is less than a thickness of the second poly-silicon layer of the thin film transistor located in the peripheral circuit area 32.

When the first amorphous silicon layer 231 and the second amorphous silicon layer 232 are annealed by adopting an excimer laser, the first amorphous silicon layer 231 and the second amorphous silicon layer 232 are melted by laser and then are crystallized, because the thickness of the first amorphous silicon layer 231 formed in the display area 31 is less than the thickness of the second amorphous silicon layer 232 formed in the peripheral circuit area 32, a grain size of the second amorphous silicon layer 232 formed after melting and crystallizing is larger than a grain size of the first amorphous silicon layer 231 formed after melting and crystallizing.

In the embodiment of the present disclosure, a xenon chloride laser or a krypton fluoride laser or an argon fluoride laser is adopted during the excimer laser annealing process, the direction of the arrow in FIG. 7 indicates the moving direction of a laser beam 30 of the Laser.

During the excimer laser annealing process, for instance, the laser has a pulse frequency of 450 Hz to 550 Hz, an overlap rate of 92% to 98%, a scanning speed of 4 mm/s to 16 mm/s, and an energy density of 300 mJ/cm$^2$ to 500 mJ/cm$^2$. In the embodiment of the present disclosure, the overlap rate of the laser is calculated by the following formula:

an overlap rate of the laser=[(a width of the laser beam−a scanning interval)/a width of the laser beam]*100%

Figure 8:
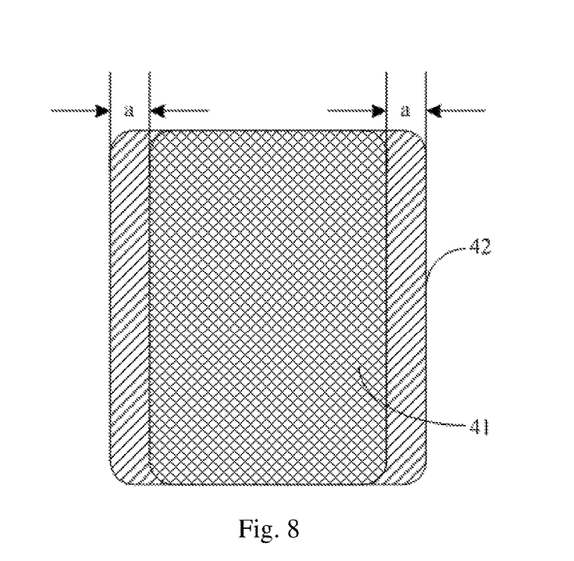
FIG. 8 is a schematic view of an overlap rate of laser in an embodiment of the present disclosure.

As illustrated in FIG. 8, the scanning interval a is a distance between a right side line of a laser beam area 41 of the Nth laser scanning and a right side line of a laser beam area 42 of the (N−1)th laser scanning, or a distance between a left side line of the laser beam area 41 of the Nth laser scanning and a left side line of the laser beam area 42 of the (N−1)th laser scanning.

In order to better covert an amorphous silicon layer into a poly-silicon layer, in the embodiment of the present disclosure, before the first amorphous silicon layer in the display area and the second amorphous silicon layer in the peripheral circuit area are subjected to the excimer laser annealing, the first amorphous silicon layer of the display area and the second amorphous silicon layer of the peripheral circuit area are heated for 0.5 to 3 hours at a temperature of 400° C. to 450° C.

In the embodiment of the present disclosure, the thickness of the poly-silicon layer formed in the display area is smaller, an average grain size of the poly-silicon grain is about 300 nm to 400 nm, and the poly-silicon layer has good uniformity, a thin film transistor which is formed by adopting a poly-silicon layer with a smaller grain size has good uniformity and can satisfy the requirement of low leakage current and threshold voltage uniformity.

In the embodiment of the present disclosure, the thickness of the poly-silicon layer formed in the peripheral circuit area is thicker, an average grain size of the poly-silicon grain is about 500 nm to 700 nm, a thin film transistor which is formed by adopting a poly-silicon layer with a lager grain size has high mobility, which can easily be larger than 200 cm$^2$/Vs, and can satisfy the requirement of high electron mobility.

The poly-silicon layer and the thin film transistor manufactured by the above mentioned method can be applicable to a low temperature poly-silicon active matrix organic light emitting diode (LTPS-AMOLED), a low temperature poly-silicon thin film transistor liquid crystal display (LTPS TFT-LCD) and the other fields.

An array substrate according to an embodiment of the present disclosure is described below.

Thickness of each layer, the size or the shape of each area in drawings does not represent the real scale of each layer, and it is merely to illustrate the present disclosure in an explanatory manner.

Figure 9:
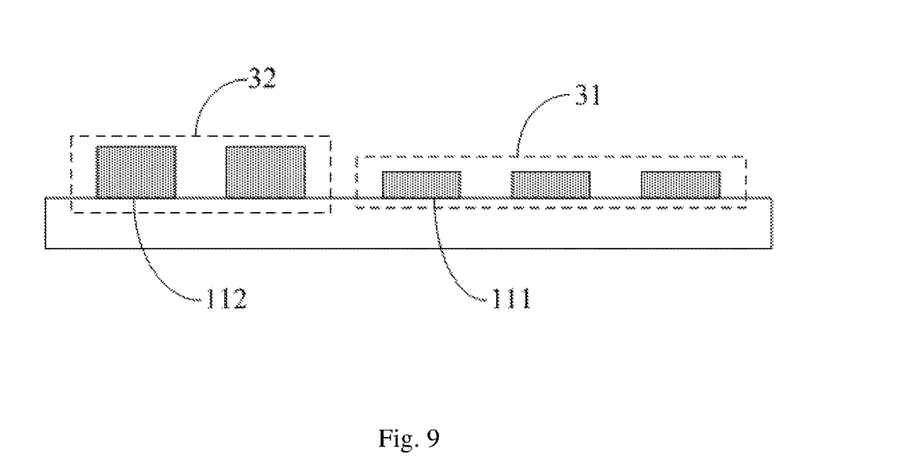
FIG. 9 is a structure schematic view of a cross-section of an array substrate comprising the poly-silicon layer in an embodiment of the present disclosure.

As illustrated in FIG. 7 and FIG. 9, at least one embodiment of the present disclosure further provides an array substrate, comprising a display area 31 and a peripheral circuit area 32, and the array substrate is formed by the above mentioned method. The thickness of the first poly-silicon layer of the thin film transistor located in the display area 31 of the array substrate is regarded as a first thickness, and the thickness of the second poly-silicon layer of the thin film transistor located in the peripheral circuit area 32 of the array substrate is regarded as a second thickness, and the first thickness is less than the second thickness.

In one embodiment of the present disclosure, the thickness 111 of the first poly-silicon layer of the thin film transistor located in the display area 31 of the array substrate is 40 nm to 50 nm; and the thickness of the second poly-silicon layer of the thin film transistor located in the peripheral circuit area 32 of the array substrate is 60 nm to 80 nm.

In the embodiment of the present disclosure, the thickness of the poly-silicon layer of the display area is smaller, the average grain size of the poly-silicon grain is about 300 nm to 400 nm, and the poly-silicon layer has good uniformity, the thin film transistor which is formed by adopting the poly-silicon layer with a smaller grain size has good uniformity and lower leakage current, at this situation, although the formed thin film transistor has lower mobility, but the requirement of the thin film transistor in the display area can be satisfied.

In the embodiment of the present disclosure, the thickness of the poly-silicon layer formed in the peripheral circuit area is thicker, the average grain size of the poly-silicon grain is about 500 nm to 700 nm, the thin film transistor which is formed by adopting the poly-silicon layer with a lager grain size has high mobility and can well satisfy the switching requirement of the thin film transistor of the driving circuit.

At least one embodiment of the present disclosure further provides a display panel, and the display panel comprises the above mentioned array substrate.

At least one embodiment of the present disclosure further provides a display device, and the display device comprises the above mentioned display panel, the display device can be a liquid crystal panel, a liquid crystal monitor, a liquid crystal television, an organic light emitting diode (OLED) panel, an OLED monitor, an OLED television, or an electronic paper and etc.

To sum up, an embodiment of the present disclosure provides a method for manufacturing an array substrate, comprising manufacturing a poly-silicon layer on a base substrate, and the method comprises forming an amorphous silicon thin film on the base substrate, forming a first amorphous silicon layer in the display area and a second amorphous silicon layer in the peripheral circuit area by a patterning process, so that a thickness of the first amorphous silicon layer is less than a thickness of the second amorphous silicon layer; and processing the first amorphous silicon layer and the second amorphous silicon layer simultaneously by an excimer laser annealing to form a first poly-silicon layer located in the display area and a second poly-silicon layer located in the peripheral circuit area, wherein a grain size of the first poly-silicon layer is less than a grain size of the second poly-silicon layer. Because the thickness of the amorphous silicon layer located in the display area is less than the thickness of the amorphous silicon layer located in the peripheral circuit area, when the poly-silicon layer is formed by the excimer laser annealing, the grain size of the second poly-silicon layer formed in the peripheral circuit area is larger than the grain size of the first poly-silicon layer formed in the display area, therefore the grain size of the poly-silicon layer of the thin film transistor formed in the peripheral circuit area is larger, which satisfies the requirement of high electron mobility, and the grain size of the poly-silicon layer of the thin film transistor formed in the display area is smaller and uniformity, which satisfies the requirements of low leakage current and threshold voltage uniformity.

What are described above is related to the illustrative embodiments of the present disclosure only and not limitative to the scope of the disclosure; the scopes of the disclosure are defined by the accompanying claims.

The application claims priority to the Chinese patent application No. 201510697688.8, filed on Oct. 23, 2015, the entire disclosure of which is incorporated herein by reference as part of the present application.

What is claimed is:

1. A method for manufacturing an array substrate comprising a display area and a peripheral circuit area, wherein the method comprises manufacturing a poly-silicon layer on a base substrate, and the manufacturing the poly-silicon layer on the base substrate comprises:
   forming an amorphous silicon thin film on the base substrate, forming a first amorphous silicon layer in the display area and a second amorphous silicon layer in the peripheral circuit area by a patterning process, so that a thickness of the first amorphous silicon layer is less than a thickness of the second amorphous silicon layer; and
   processing the first amorphous silicon layer and the second amorphous silicon layer simultaneously by an excimer laser annealing to form a first poly-silicon layer in the display area and a second poly-silicon layer in the peripheral circuit area, a grain size of the first poly-silicon layer being less than a grain size of the second poly-silicon layer,
   wherein forming the first amorphous silicon layer in the display area and the second amorphous silicon layer in the peripheral circuit area by the patterning process comprises:
      coating photoresist on the amorphous silicon thin film, forming a photoresist completely reserving area, a photoresist partially reserving area and a photoresist completely removing area by exposing and developing the photoresist with a half-tone or gray-tone mask, the photoresist completely reserving area corresponding to an area for forming the second amorphous silicon layer in the peripheral circuit area, the photoresist partially reserving area corresponding to an area for forming the first amorphous silicon layer in the display area, and the photoresist completely removing area corresponding to other areas in the display area and the peripheral circuit area;
      removing the amorphous silicon thin film in the photoresist completely removing area by a first etching;
      removing the photoresist of the photoresist partially reserving area, and removing a part of the whole thickness of the amorphous silicon thin film in the photoresist partially reserving area by a second etching to form the first amorphous silicon layer; and
      removing the photoresist in the photoresist completely reserving area to form the second amorphous silicon layer.

2. The method according to claim 1, wherein the thickness of the first amorphous silicon layer is 40 nm to 50 nm, and the thickness of the second amorphous silicon layer is 60 nm to 80 nm.

3. The method according to claim 1, wherein before processing the first amorphous silicon layer and the second amorphous silicon layer by the excimer laser annealing, the method further comprises:
   heating the first amorphous silicon layer and the second amorphous silicon layer for 0.5 to 3 hours at a temperature of 400° C. to 450° C.

4. The method according to claim 1, wherein during the excimer laser annealing, a xenon chloride laser or a krypton fluoride laser or an argon fluoride laser is employed.

5. The method according to claim 1, wherein during the excimer laser annealing, a laser has a pulse frequency of 450 Hz to 550 Hz, an overlap rate of 92% to 98%, a scanning speed of 4 mm/s to 16 mm/s, and an energy density of 300 mJ/cm$^2$ to 500 mJ/cm$^2$.

6. An array substrate, comprising the display area and the peripheral circuit area, wherein the array substrate is formed by the method according to claim 1.

7. The array substrate according to claim 6, wherein a thickness of the first poly-silicon layer in the display area is 40 nm to 50 nm, and a thickness of the second poly-silicon layer in the peripheral circuit area is 60 nm to 80 nm.

8. A display panel, comprising the array substrate according to claim 6.

9. A display device, comprising the array substrate according to claim 8.

10. The display panel according to claim 8, wherein a thickness of the first poly-silicon layer in the display area is 40 nm to 50 nm, and a thickness of the second poly-silicon layer in the peripheral circuit area is 60 nm to 80 nm.

* * * * *